United States Patent
Ma et al.

(10) Patent No.: US 12,298,474 B2
(45) Date of Patent: May 13, 2025

(54) ARTICLE HAVING A HIGH VISIBLE LIGHT REFLECTANCE AND A NEUTRAL COLOR

(71) Applicant: Vitro Flat Glass LLC, Cheswick, PA (US)

(72) Inventors: Zhixun Ma, Pittsburgh, PA (US); Adam D. Polcyn, Pittsburgh, PA (US); Andrew Wagner, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 362 days.

(21) Appl. No.: 16/830,691

(22) Filed: Mar. 26, 2020

(65) Prior Publication Data
US 2020/0308045 A1 Oct. 1, 2020

Related U.S. Application Data

(60) Provisional application No. 62/976,645, filed on Feb. 14, 2020, provisional application No. 62/825,326, filed on Mar. 28, 2019.

(51) Int. Cl.
*C03C 17/36* (2006.01)
*B32B 7/025* (2019.01)
(Continued)

(52) U.S. Cl.
CPC .............. *G02B 1/116* (2013.01); *B32B 7/025* (2019.01); *B32B 17/10036* (2013.01);
(Continued)

(58) Field of Classification Search
None
See application file for complete search history.

(56) References Cited

U.S. PATENT DOCUMENTS

| 3,762,988 A | 10/1973 | Clock et al. |
| 4,287,107 A | 9/1981 | Hermann et al. |

(Continued)

FOREIGN PATENT DOCUMENTS

| CH | 339575 A | 6/1959 |
| CN | 1944545 A | 4/2007 |

(Continued)

OTHER PUBLICATIONS

Gu et al., "Ultrasmooth and Thermally Stable Silver-Based Thin Films with Subnanometer Roughness by Aluminum Doping", ACSNANO, 2014, pp. 10343-10351, vol. 8:10.

(Continued)

*Primary Examiner* — David Sample
(74) *Attorney, Agent, or Firm* — The Webb Law Firm

(57) ABSTRACT

A coated article includes a substrate and a coating applied over at least a portion of the substrate. The coating includes: a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; a third dielectric layer over at least a portion of the second primer layer; and an outermost protective layer formed over at least a portion of the third dielectric layer. The coated article wherein the RgL* value is at least 35, and no more than 55. The coated article has a total combined thickness of the metallic layers of at least 10 nanometers, and no more than 30 nanometers.

18 Claims, 2 Drawing Sheets

(51) Int. Cl.

| | | |
|---|---|---|
| *B32B 17/10* | (2006.01) | |
| *B60J 3/00* | (2006.01) | |
| *B60K 35/00* | (2006.01) | |
| *C23C 14/00* | (2006.01) | |
| *G02B 1/116* | (2015.01) | |
| *G02B 5/28* | (2006.01) | |
| *G02B 27/01* | (2006.01) | |
| *H05B 3/84* | (2006.01) | |
| *H05B 3/86* | (2006.01) | |
| *B60K 35/23* | (2024.01) | |
| *B60K 35/40* | (2024.01) | |

(52) U.S. Cl.
CPC .. *B32B 17/10201* (2013.01); *B32B 17/10229* (2013.01); *B60J 3/007* (2013.01); *B60K 35/00* (2013.01); *C03C 17/3639* (2013.01); *C03C 17/3649* (2013.01); *C03C 17/366* (2013.01); *C23C 14/0036* (2013.01); *G02B 5/285* (2013.01); *G02B 27/0101* (2013.01); *H05B 3/84* (2013.01); *H05B 3/86* (2013.01); *B32B 2250/05* (2013.01); *B60K 35/23* (2024.01); *B60K 35/425* (2024.01); *C03C 2218/155* (2013.01); *G02B 2027/012* (2013.01); *H05B 2203/013* (2013.01)

(56) References Cited

U.S. PATENT DOCUMENTS

| | | |
|---|---|---|
| 4,379,040 A | 4/1983 | Gillery |
| 4,466,562 A | 8/1984 | DeTorre |
| 4,606,800 A | 8/1986 | Hart et al. |
| 4,610,771 A | 9/1986 | Gillery |
| 4,671,155 A | 6/1987 | Goldinger |
| 4,716,086 A | 12/1987 | Gillery et al. |
| 4,746,347 A | 5/1988 | Sensi |
| 4,792,536 A | 12/1988 | Pecoraro et al. |
| 4,806,220 A | 2/1989 | Finley |
| 4,834,857 A | 5/1989 | Gillery |
| 4,861,669 A | 8/1989 | Gillery |
| 4,898,789 A | 2/1990 | Finley |
| 4,898,790 A | 2/1990 | Finley |
| 4,900,633 A | 2/1990 | Gillery |
| 4,902,580 A | 2/1990 | Gillery |
| 4,902,581 A | 2/1990 | Criss |
| 4,920,006 A | 4/1990 | Gillery |
| 4,938,857 A | 7/1990 | Gillery |
| 4,948,677 A | 8/1990 | Gillery |
| 5,028,759 A | 7/1991 | Finley |
| 5,030,593 A | 7/1991 | Heithoff |
| 5,030,594 A | 7/1991 | Heithoff |
| 5,059,295 A | 10/1991 | Finley |
| 5,112,693 A | 5/1992 | Gillery |
| 5,240,886 A | 8/1993 | Gulotta et al. |
| 5,328,768 A | 7/1994 | Goodwin |
| 5,385,872 A | 1/1995 | Gulotta et al. |
| 5,393,593 A | 2/1995 | Gulotta et al. |
| 5,492,750 A | 2/1996 | Shumaker, Jr. et al. |
| 5,619,059 A | 4/1997 | Li et al. |
| 5,653,903 A | 8/1997 | Pinchok, Jr. et al. |
| 5,792,559 A | 8/1998 | Heithoff et al. |
| 5,796,055 A | 8/1998 | Benson, Jr. et al. |
| 5,821,001 A | 10/1998 | Arbab et al. |
| 5,923,471 A | 7/1999 | Wood, II et al. |
| 6,164,777 A | 12/2000 | Li et al. |
| 6,495,251 B1 | 12/2002 | Arbab et al. |
| 6,838,181 B1 | 1/2005 | Degand |
| 7,537,677 B2 | 5/2009 | Lu et al. |
| 7,588,829 B2 | 9/2009 | Finley et al. |
| 7,972,713 B2 | 7/2011 | Fleury et al. |
| 8,003,235 B2 | 8/2011 | Gagliardi et al. |
| 8,025,957 B2 | 9/2011 | Thiel |
| 8,203,073 B2 | 6/2012 | Lu et al. |
| 8,221,833 B2 | 7/2012 | Veerasamy et al. |
| 8,420,162 B2 | 4/2013 | Blacker et al. |
| 8,440,037 B2 | 5/2013 | Dietrich et al. |
| 8,440,310 B2 | 5/2013 | Ferreira et al. |
| 8,497,014 B2 | 7/2013 | Unquera et al. |
| 8,686,319 B2 | 4/2014 | Thiel |
| 8,722,210 B2 | 5/2014 | Jun et al. |
| 8,974,864 B2 | 3/2015 | Finley et al. |
| 9,003,697 B2 | 4/2015 | Giesen et al. |
| 9,012,044 B2 | 4/2015 | Bright |
| 9,028,930 B2 | 5/2015 | Reymond et al. |
| 9,034,459 B2 | 5/2015 | Condo et al. |
| 9,062,366 B2 | 6/2015 | An et al. |
| 9,067,822 B2 | 6/2015 | Maschwitz et al. |
| 9,126,861 B2 | 9/2015 | Hashizume et al. |
| 9,140,832 B2 | 9/2015 | Medwick et al. |
| 9,199,874 B2 | 12/2015 | Peter et al. |
| 9,296,649 B2 | 3/2016 | Okawa et al. |
| 9,449,899 B2 | 9/2016 | Briere et al. |
| 9,556,068 B2 | 1/2017 | Buhay et al. |
| 9,599,752 B2 | 3/2017 | Laurent et al. |
| 9,606,272 B2 | 3/2017 | Sandre-Chardonnal |
| 9,630,875 B2 | 4/2017 | McSporran et al. |
| 9,709,717 B2 | 7/2017 | Hevesi et al. |
| 9,738,561 B2 | 8/2017 | Butz et al. |
| 9,758,426 B2 | 9/2017 | Kabagambe et al. |
| 9,776,915 B2 | 10/2017 | Wuillaume et al. |
| 9,822,033 B2 | 11/2017 | Imran et al. |
| 9,919,960 B2 | 3/2018 | Mahieu |
| 9,950,951 B2 | 4/2018 | Sternchuss et al. |
| 9,971,194 B2 | 5/2018 | Brecht et al. |
| 10,040,719 B2 | 8/2018 | Eby et al. |
| 10,078,409 B2 | 9/2018 | Veerasamy et al. |
| 10,099,958 B2 | 10/2018 | Brossard et al. |
| 10,294,149 B2 | 5/2019 | Wagner et al. |
| 10,358,384 B2 | 7/2019 | Polcyn et al. |
| 10,453,580 B1 | 10/2019 | Wilson et al. |
| 10,472,881 B2 | 11/2019 | Kuhn et al. |
| 10,479,724 B2 | 11/2019 | Ganjoo et al. |
| 10,502,878 B2 | 12/2019 | Ding et al. |
| 10,539,726 B2 | 1/2020 | Wagner et al. |
| 10,562,813 B2 | 2/2020 | Roquiny et al. |
| 10,597,324 B2 | 3/2020 | Miki Yoshida et al. |
| 10,618,252 B2 | 4/2020 | Wagner et al. |
| 10,654,747 B2 | 5/2020 | Polcyn et al. |
| 10,654,749 B2 | 5/2020 | Polcyn et al. |
| 11,078,718 B2 | 8/2021 | Fisher et al. |
| 11,402,557 B2 | 8/2022 | Wagner et al. |
| 12,060,751 B2 | 8/2024 | Paul et al. |
| 2002/0119337 A1 | 8/2002 | Maze et al. |
| 2002/0172775 A1 | 11/2002 | Buhay et al. |
| 2003/0031842 A1 | 2/2003 | Marietti et al. |
| 2003/0180547 A1 | 9/2003 | Buhay et al. |
| 2003/0228476 A1 | 12/2003 | Buhay et al. |
| 2003/0228484 A1 | 12/2003 | Finley et al. |
| 2004/0023038 A1 | 2/2004 | Buhay et al. |
| 2004/0023080 A1 | 2/2004 | Buhay et al. |
| 2004/0106017 A1 | 6/2004 | Buhay et al. |
| 2005/0095449 A1 | 5/2005 | Yanagisawa et al. |
| 2005/0123772 A1 | 6/2005 | Coustet et al. |
| 2005/0258030 A1* | 11/2005 | Finley ............... C03C 17/36 204/192.27 |
| 2007/0020465 A1 | 1/2007 | Thiel et al. |
| 2007/0036990 A1* | 2/2007 | Dietrich ........... C03C 17/3639 428/428 |
| 2007/0082219 A1 | 4/2007 | Fleury et al. |
| 2007/0224432 A1 | 9/2007 | Morimoto et al. |
| 2008/0174872 A1 | 7/2008 | Morimoto et al. |
| 2008/0187692 A1* | 8/2008 | Roquiny ........... C03C 17/3626 428/432 |
| 2008/0311389 A1* | 12/2008 | Roquiny ........... C03C 17/366 428/336 |
| 2009/0011205 A1* | 1/2009 | Thiel ............... C03C 17/3681 428/215 |
| 2009/0015909 A1 | 1/2009 | Fleury et al. |
| 2009/0047466 A1* | 2/2009 | German ............ C03C 17/3639 428/98 |
| 2009/0176086 A1 | 7/2009 | Martin et al. |
| 2011/0236663 A1 | 9/2011 | Fleury et al. |
| 2011/0236715 A1 | 9/2011 | Polcyn et al. |

(56) References Cited

U.S. PATENT DOCUMENTS

| | | |
|---|---|---|
| 2011/0262726 A1 | 10/2011 | Knoll et al. |
| 2011/0268941 A1 | 11/2011 | Fischer et al. |
| 2012/0087005 A1 | 4/2012 | Reymond et al. |
| 2012/0177900 A1 | 7/2012 | Laurent et al. |
| 2013/0057951 A1 | 3/2013 | Hevesi et al. |
| 2013/0059137 A1 | 3/2013 | Hevesi et al. |
| 2014/0072784 A1 | 3/2014 | Dietrich et al. |
| 2014/0193616 A1 | 7/2014 | Polcyn et al. |
| 2014/0272353 A1* | 9/2014 | Ding .......... G02B 1/10 204/192.1 |
| 2014/0272453 A1 | 9/2014 | Polcyn et al. |
| 2015/0004383 A1 | 1/2015 | Sandre-Chardonnal |
| 2015/0125635 A1* | 5/2015 | O'Connor .......... C03C 17/3618 428/34 |
| 2016/0023942 A1* | 1/2016 | Mahieu .......... C03C 17/3644 428/433 |
| 2016/0031750 A1 | 2/2016 | Ridealgh et al. |
| 2016/0077320 A1 | 3/2016 | Okada et al. |
| 2016/0122236 A1 | 5/2016 | Mahieu et al. |
| 2016/0223729 A1 | 8/2016 | Medwick et al. |
| 2016/0244361 A1 | 8/2016 | Rondeau et al. |
| 2017/0144927 A1 | 5/2017 | Caillet et al. |
| 2017/0144928 A1 | 5/2017 | Caillet et al. |
| 2017/0183255 A1 | 6/2017 | Walther et al. |
| 2017/0198518 A1 | 7/2017 | Caillet et al. |
| 2017/0240462 A1* | 8/2017 | Wagner .......... C03C 17/3681 |
| 2017/0341977 A1 | 11/2017 | Polcyn et al. |
| 2018/0029930 A1 | 2/2018 | Lorenzzi et al. |
| 2018/0194677 A1 | 7/2018 | Lorenzzi et al. |
| 2018/0208503 A1 | 7/2018 | Hagen et al. |
| 2018/0244567 A1 | 8/2018 | Singh et al. |
| 2018/0291499 A1 | 10/2018 | Koch |
| 2018/0323401 A1 | 11/2018 | Sato et al. |
| 2019/0039947 A1 | 2/2019 | Fisher et al. |
| 2019/0055157 A1 | 2/2019 | Hagen et al. |
| 2019/0064516 A1 | 2/2019 | Wagner et al. |
| 2019/0242178 A1 | 8/2019 | Fisher et al. |
| 2019/0330101 A1* | 10/2019 | Cid Aguilar .......... C03C 17/3636 |
| 2019/0352224 A1 | 11/2019 | You et al. |
| 2020/0009836 A1 | 1/2020 | Braley |
| 2020/0055285 A1 | 2/2020 | Compoint et al. |
| 2020/0085170 A1 | 3/2020 | Yang et al. |
| 2020/0096687 A1 | 3/2020 | Ma et al. |
| 2020/0101700 A1 | 4/2020 | Lee et al. |
| 2020/0165163 A1 | 5/2020 | Mizutani et al. |
| 2020/0310014 A1 | 10/2020 | Bard et al. |
| 2020/0359467 A1 | 11/2020 | Farreyrol et al. |
| 2021/0017811 A1 | 1/2021 | Han |
| 2021/0053869 A1 | 2/2021 | Dehner et al. |
| 2021/0122670 A1 | 4/2021 | Misra et al. |
| 2022/0119305 A1 | 4/2022 | Fisher et al. |

FOREIGN PATENT DOCUMENTS

| | | | |
|---|---|---|---|
| DE | 102014002965 A1 | 2/2015 | |
| JP | H10182192 A | 7/1998 | |
| JP | 2016540723 A | 12/2016 | |
| WO | 0037384 A1 | 6/2000 | |
| WO | 2015101744 A1 | 7/2015 | |
| WO | 20180480038 A1 | 3/2018 | |
| WO | WO-2018117801 A1 * | 6/2018 | ............ B32B 15/00 |
| WO | 2018160616 A2 | 9/2018 | |
| WO | 2019004199 A1 | 1/2019 | |
| WO | 2019053741 A1 | 3/2019 | |
| WO | 2019074901 A1 | 4/2019 | |
| WO | 2019120849 A1 | 6/2019 | |
| WO | 2019120850 A1 | 6/2019 | |
| WO | 2019143597 A1 | 7/2019 | |
| WO | 2019145256 A1 | 8/2019 | |
| WO | 2019151431 A1 | 8/2019 | |
| WO | 2019190419 A2 | 10/2019 | |
| WO | 2019190420 A2 | 10/2019 | |
| WO | 2019207241 A1 | 10/2019 | |
| WO | 2019216661 A1 | 11/2019 | |
| WO | 2020058061 A1 | 3/2020 | |

OTHER PUBLICATIONS

Kawamura et al., "Thermally stable very thin Ag films for electrodes", J. Vac. Sci. Technol. A., 2009, pp. 975-978, vol. 27:4.

Han et al., "Improved conductivity and mechanism of carrier transport in zinc oxide with embedded silver layer" J. of Appl. Phys. 2008, pp. 1-9, vol. 103, No. 013708.

Liu et al., "A new method for fabricating ultrathin metal films as scratch-resistant flexible transparent electrodes". Journal of Materiomics, 2015, pp. 52-59, vol. 1, No. (1).

Sharma et al., "High-performance radiation stable ZnO/Ag/ZnO multilayer transparent conductive electrode" Solar Energy Materials and Solar Cells, 2017, pp. 122-131, vol. 169.

Zhang et al., "Effects of Nb Surface and Ti Interface Layers on Thermal Stability and Electrical Resistivity of Ag Thin Films", Jpn. J. Appl. Phys., 2012, pp. 1-7, vol. 51.

Zhang et al., "Optimization of Surface Layers for Suppression of Agglomeration in Ag Films" Jpn. J. Appl. Phys., 2013, pp. 1-13, vol. 52, No. 7.

Ries, "Silver thin films: Improving the efficiency of low-E coatings by employing different seed layers", 2015, pp. 1-199.

"Technical Information: What you need to know to Build With Light®", Guardian Glass LLC, 2019, pp. 1-36.

* cited by examiner

ARTICLE HAVING A HIGH VISIBLE LIGHT REFLECTANCE AND A NEUTRAL COLOR

CROSS REFERENCE TO RELATED APPLICATIONS

The present application is entitled to and claims priority to U.S. Provisional Application No. 62/976,645 filed Feb. 14, 2020 and U.S. Provisional Application No. 62/825,326 filed Mar. 28, 2019, the disclosures of which are incorporated by reference.

BACKGROUND OF THE INVENTION

Field of the Invention

The invention relates generally to vehicle transparencies, such as vehicle windshields, and in one particular embodiment, a windshield having a high visible light reflectance and neutral color.

Technical Considerations

In the automotive market, there is a heavy emphasis is placed on vehicle styling. The way a vehicle looks can be as important to vehicle sales as the vehicle's mechanical reliability or safety rating. Therefore, automotive manufacturers have gone to great lengths to enhance vehicle styling. These styling enhancements include providing more color selections to the consumer and also providing colors having metallic flakes to provide a vehicle with a "photochromic effect".

While these styling enhancements have been generally well received by consumers, a problem to date is that even with the new vehicle paint finishes, the automotive transparencies (such as but not limited to windshields, side lights, back lights, moon roofs, and sun roofs) continue to be generally gray or neutral colored. While providing solar control properties, these conventional transparencies provide little enhancement to the vehicle styling.

In the non-automotive fields, it has been known to provide coated articles in which a color is generated by the interference effect between a substrate and a coating. As will be appreciated by one skilled in the art, the term "interference effect" refers to the variation of electromagnetic wave amplitude with distance or time, caused by the superposition of waves of electromagnetic radiation (for example, visible light). These waves can be the result of reflection or transmission at the interfaces of one or more layers in an optical thin film coating. For example, U.S. Pat. No. 6,164,777 discloses a plastic contact lens having an interference coating made of alternating materials of different refractive indices. U.S. Pat. No. 5,923,471 discloses a "hot mirror" for a heat lamp having alternating layers of zirconia and silica. U.S. Pat. Appl. Publ. No. 2003/0031842 A1 discloses an article with a patterned appearance provided by a visually observable contrast between one or more generally transparent thin film coatings. Other examples of interference coatings and coated articles are discussed in U.S. Pat. Nos. 5,619,059; 4,902,581; and 5,112,693; and Swiss Pat. No. 339575.

While these disclosed coatings are suitable for their intended purpose, numerous other considerations must be addressed in trying to incorporate an interference coating into an automotive transparency. For example, in the United States, government regulations require that all windshields must have a luminous (visible) light transmittance (LTA) of at least 70%. In Europe, the required minimum LTA is 75%. The presence of an interference coating could adversely impact upon the light transmittance of the transparency.

It would be advantageous to provide a method of making an automotive transparency that is aesthetically pleasing and could be used to enhance the styling of a vehicle. It would also be advantageous to provide an automotive transparency that provides the opportunity to color coordinate or match the color of the transparency with the paint color of the vehicle. It would further be advantageous if such a transparency also met the mandated government requirements for automotive transparencies.

SUMMARY OF THE INVENTION

The invention relates to a coated article. The coated article has a substrate, and a functional coating over the substrate. The coating has a first dielectric layer positioned over at least a portion of the substrate. A first metallic layer is positioned over at least a portion of first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. An optional outermost protective coating is positioned over at least a portion of the third dielectric layer or the functional coating. The coated article has an $RgL^*$ value of at least 35 and no more than 55.

In another embodiment, the invention relates to a coated article. The coated article has a substrate, and a functional coating over the substrate. The coating has a first dielectric layer positioned over at least a portion of the substrate. A first metallic layer is positioned over at least a portion of first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. An optional outermost protective coating is positioned over at least a portion of the third dielectric layer or the functional coating. The total combined thickness of the metallic layers is at least 10 nm and not more than 30 nm.

BRIEF DESCRIPTION OF THE DRAWINGS

The invention will be described with reference to the following drawing figures wherein like reference numbers, identify like parts throughout.

DESCRIPTION OF THE INVENTION

Figure 1:
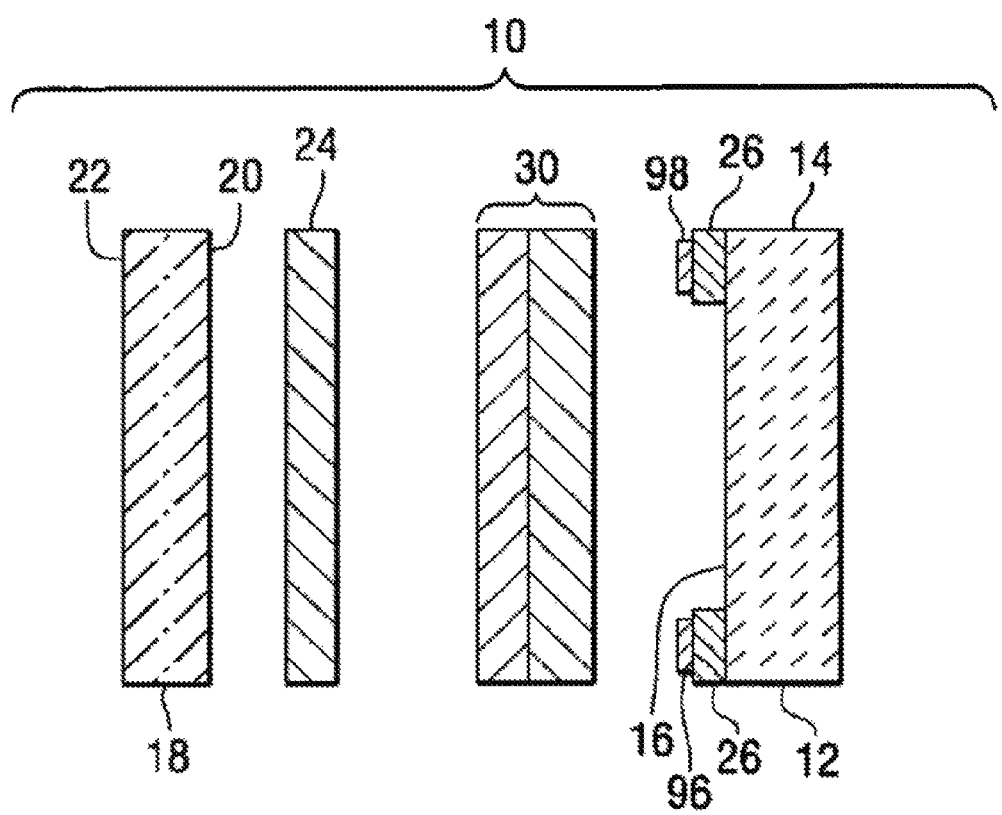
FIG. 1 is a cross-sectional view (not to scale) of a non-limiting windshield.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about." Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in the light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g. 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nanometers (nm) to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm. Visible (luminous) transmittance (LTA) values (Y, x, y) herein are those determinable using C.I.E. (1976) standard illuminant "A" with a 2 degree observer (in conformance with U.S. Federal standards) over the wavelength range of 380 nm to 770 nm using a Lambda 9 spectrophotometer commercially available from Perkin-Elmer or TCS spectrophotometer commercially available from BYK-Gardner. Reflected color values L*, a*, b* (whether R1 or R2) were determined using an illuminant "D65" with a 10° observer (as is conventional in the automotive field).

As used herein, the term "film" refers to a coating region of a desired or selected coating composition. A "layer" can comprise one or more "films", and a "coating" or "coating stack" can comprise one or more "layers". The terms "metal" and "metal oxide" include silicon and silica, respectively, as well as traditionally recognized metals and metal oxides, even though silicon conventionally may not be considered a metal. Thickness values, unless indicated to the contrary, are geometric thickness values. Additionally, all documents, such as, but not limited to issued patents and patent applications, referred to herein, are to be considered "incorporated by reference" in their entirety.

The discussion of the invention may describe certain features as being "particularly" or "preferably" within certain limitations (e.g. "preferably", "more preferably", or "most preferably", within certain limitations). It is to be understood that the invention is not limited to these particular or preferred limitations but encompasses the entire scope of the disclosure.

A non-limiting transparency 10 (e.g., automotive windshield) incorporating features of the invention is illustrated in FIG. 1. The transparency 10 can have any desired visible light, infrared radiation, or ultraviolet radiation transmission and reflection. For example, the transparency 10 can have a visible light transmission of any desired amount, e.g. greater than 0% to 100%, greater than 70%. For windshield and front sidelight areas in the United States, the visible light transmission is typically greater than or equal to 70%. For privacy areas, such as rear seat sidelights and rear windows, the visible light transmission can be less than that for windshields, such as less than 70%.

As seen in FIG. 1, the transparency 10 includes a first ply or first substrate 12 with a first major surface facing the vehicle exterior, i.e. an outer major surface 14 (No. 1 surface) and an opposed second or inner major surface 16 (No. 2 surface). The transparency 10 also includes a second ply or second substrate 18 having an outer (first) major surface 22 (No. 4 surface) and an inner (second) major surface 20 (No. 3 surface). This numbering of the ply surfaces is in keeping with conventional practice in the automotive art. The first and second plies 12, 18 can be bonded together in any suitable manner, such as by conventional interlayer 24. Although not required, a conventional edge sealant can be applied to the perimeter of the laminated transparency 10 during and/or after lamination in any desired manner. A decorative band, e.g., an opaque, translucent, or colored shade band 26, such as a ceramic band, can be provided on a surface of at least one of plies 12, 18, for example around the perimeter of the inner major surface 16 of the first ply 12. A coating 30 can be formed over at least a portion of one of the plies 12, 18, such as over the No. 2 surface 16 or No. 3 surface 20.

In the non-limiting embodiment illustrated in FIG. 1, the bus bar assembly includes a first or bottom bus bar 96 and a second or top bus bar 98 formed on the inner surface 16 of the outer ply 12 and separated by a bus bar to bus bar distance. The bus bars 96, 98 are in electrical contact with the coating 30. In one non-limiting embodiment of the invention the bus bars 96, 98 can be positioned at least partially on, or completely on, the decorative band 26, as shown in FIG. 1.

In the broad practice of the invention, the plies 12, 18 of the transparency 10 can be of the same or different materials. The plies 12, 18 can include any desired material having any desired characteristics. For example, one or more of the plies 12, 18 can be transparent or translucent to visible light. By "transparent" is meant having visible light transmittance of greater than 0% to 100%. Alternatively, one or more plies 12, 18 can be translucent. By "translucent" is meant allowing electromagnetic energy (e.g., visible light) to pass through but diffusing this energy such that objects on the side opposite the viewer are not clearly visible. Examples of suitable materials, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalate, and the like; polysiloxane-containing polymers; or copolymers of any monomers for preparing these, or any mixtures thereof); ceramic substrates; glass substrates; or mixtures or combinations of any of the above. For example, one or more of the plies 12, 18 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat-treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The ribbon is then cut and/or shaped and/or heat treated as desired. Examples of float glass processes are disclosed in U.S. Pat. Nos. 4,466,562 and 4,671,155. The first and second plies 12, 18 can be, for example, clear float glass or can be tinted or colored glass or one ply 12, 18 can be clear glass and the other ply 12, 18 colored glass. Although not limiting to the invention, examples of glass suitable for the first ply 12 and/or second ply 18 are described in U.S. Pat. Nos. 4,746,347; 4,792,536; 5,030,593; 5,030,594; 5,240,886; 5,385,872; and 5,393,593. The first and second plies 12, 18 can be of any desired dimensions, e.g., length, width, shape, or thickness. In one exemplary automotive transparency 10, the first and second plies 12, 18 can each be 1 mm to 10 mm thick, e.g., 1 mm to 5 mm thick, or 1.5 mm to 2.5 mm, or 1.8 mm to 2.3 mm. In one non-limiting embodiment, the first ply 12 and/or the second ply 18 can have a visible light transmittance of greater than 90%, such as greater than 91%, at a reference wavelength of 550 nm. The glass composition for the first ply 12 and/or second ply 18 can have a total iron content in the range of greater than 0 weight percent (wt. %) to 0.2 wt. % and/or a redox ratio in the range of 0.3 to 0.6.

In one non-limiting embodiment, one or both of the plies 12, 18 may have a high visible light transmittance at a reference wavelength of 550 nm. By "high visible light transmittance" is meant visible light transmittance at 550 nm greater than or equal to 85%, such as greater than or equal to 87%, such as greater than or equal to 90%, such as greater than or equal to 91%, such as greater than or equal to 92%, at 5.5 mm equivalent thickness for glass from 2 mm to 25 mm sheet thickness. Particularly useful glass for the practice of the invention is disclosed in U.S. Pat. Nos. 5,030,593 and 5,030,594.

The interlayer 24 can be of any desired material and can include one or more layers or plies. The interlayer 24 can be a polymeric or plastic material, such as, for example, polyvinylbutyral (PVB), plasticized polyvinyl chloride, or multi-layered thermoplastic materials including polyethyleneterephthalate, etc. Suitable interlayer materials are disclosed, for example but not to be considered as limiting, in U.S. Pat. Nos. 4,287,107 and 3,762,988. The interlayer 24 can also be a sound absorbing or attenuating material as described, for example, in U.S. Pat. No. 5,796,055. The interlayer 24 can have a solar control coating provided thereon or incorporated therein or can include a colored material to reduce solar energy transmission.

The coating 30 is deposited over at least a portion of a major surface of one of the glass plies 12, 18 such as on the inner surface 16 of the outboard glass ply 12 or the inner surface 20 of the interior glass ply 18 (FIG. 1). The coating 30 can include two metallic films positioned between dielectric layers applied sequentially over at least a portion of one of the glass plies 12, 18. The coating 30 can be a heat and/or radiation reflecting coating or a solar control coating and can have one or more coating layers or films of the same or different composition and/or functionality. The coating 30 can be a multi-layer coating including two metallic layers. Examples of electrically conductive coatings used to make heatable windows are disclosed in U.S. Pat. Nos. 5,653,903 and 5,028,759. Examples of solar control coatings that can be used in the practice of the invention are found in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also U.S. patent application Ser. No. 09/058,440.

Non-limiting examples of suitable coatings 30 typically include one or more antireflective coating films comprising dielectric or anti-reflective materials, such as metal oxides or oxides of metal alloys, which as transparent to visible light. The coating 30 can also include two metallic layers comprising a reflective metal, e.g., a noble metal such as silver or gold, or alloys, mixtures, or combinations thereof, and can further comprise a primer layer or barrier film, such as titanium or a titanium aluminum alloy, as is known in the art, located over and/or optionally under the metal reflective layer. The coating 30 can have one metallic layer; or can have at least two metallic layers. For example, the coating 30 consists of two metallic layers. In one non-limiting embodiment, one or more of the metallic layers can comprise silver.

Non-limiting examples of suitable materials for the primer layer include zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof. The primer layer may also take the form of a metal, oxide, sub-oxide, nitride, and/or sub-nitride of any of the above list of materials. At least a portion of the primer layer is an oxide or a nitride. In certain embodiments, the primer layer is deposited in a 100% Argon environment. In certain embodiments, a portion of the primer layer is a nitride formed by sputtering the metal or metal alloy in a nitrogen ($N_2$) atmosphere that has a specific flow rate as to form an atmosphere of 80% $N_2$, with the remainder argon. The flow rate is an approximation to the amount of $N_2$ in the atmosphere, but that one of ordinary skill in the art would recognize that additional $N_2$ may leak into the coating chamber as the coating chamber is not hermetically sealed from the outside environment. In certain embodiments, a portion of the primer layer is a sub-oxide formed by sputtering the metal or metal alloy in an oxygen ($O_2$) atmosphere that has a specific flow rate as to form an atmosphere of 3% to 7% $O_2$, with the remainder argon. The flow rate is an approximation to the amount of oxygen ($O_2$) in the atmosphere, but that one of ordinary skill in the art would recognize that additional $O_2$ may leak into the coating chamber as the coating chamber is not hermetically sealed from the outside environment. The chemical structure of the primer material is designated by weight percent (wt. %) of an element, x. For certain compositions, the lower limit of one of the materials in the composition may be "greater than 0". When the lower limit is greater than zero (>0), the wt. % of the material is not equal to zero but may be any wt. % greater than 0 up to the wt. % of the upper limit. The composition can change before or after the layer is heated, due to reactions with atmospheric species. These reactions can change the wt. % distributed between the materials of the composition. Compositions of non-limiting examples of primer layers can be found in Table 1, where before heating is BH and after heating is AH. Some materials may only have only BH or AH measurements due to that measurement being more important for the final composition.

TABLE 1

Compositions of Metals for Metal Alloys Used as Primer Layers

| Material | Range (wt. %) | Preferred Range (wt. %) | More Preferred Range (wt. %) | Most Preferred Range (wt. %) |
| --- | --- | --- | --- | --- |
| $Al_xZn_{1-x}$ | x = >0 to 30 | x = >0 to 20 | x = >0 to 15 | x = 1 to 12 |
| $Ga_xZn_{1-x}$ | x = >0 to 20 | x = >0 to 15 | x = >0 to 10 | x = 1 to 5 |
| $In_xZn_{1-x}$ | x = >0 to 40 | x = >0 to 18 | x = >0 to 15 | x = 1 to 10 |
| $V_xZn_{1-x}$ | x = >0 to 20 | x = >0 to 15 | x = >0 to 10 | x = 1 to 5 |
| $Ag_xZn_{1-x}$ | x = >0 to 50 | x = >0 to 40 | x = >0 to 30 | x = 5 to 30 |
| $Al_xTi_{1-x}$ | x = 2 to 75 (BH) | x = 2 to 60 (BH) | x = 2 to 50 (BH) | x = 2 to 40 (BH) |
|  | x = 1 to 100 (AH) | x = 1 to 98 (AH) | x = 2 to 95 (AH) | x = 2 to 15 (AH) |
|  |  |  |  | x = 20 to 95 (AH) |
| $Al_xNb_{1-x}$ | x = 2 to 40 (BH) | x = 2 to 30 (BH) | x = 2 to 19 (BH) | x = 2 to 13 (BH) |
|  | x = 2 to 95 (AH) | x = 2 to 80 (AH) | x = 3 to 60 (AH) | x = 4 to 45 (AH) |
| $Al_xNb_{1-x}$ nitride | x = 1 to 100 (BH) | x = 1 to 98 (BH) | x = 1 to 95 (BH) | x = 2 to 93 (BH) |
|  | x = 1 to 100 (AH) | x = 2 to 75 (AH) | x = 3 to 50 (AH) | x = 4 to 40 (AH) |
| $W_xTi_{1-x}$ sub-oxide (7% $O_2$) | x = 55 to 100 (BH) | x = 65 to 100 (BH) | x = 75 to 100 (BH) | x = 80 to 100 (BH) |
| $W_xTi_{1-x}$ sub-oxide (3% $O_2$) | x = 30 to 95 (AH) | x = 40 to 95 (AH) | x = 50 to 95 (AH) | x = 55 to 95 (AH) |
| $Ti_xTa_{1-x}$ | x = 2 to 80 (BH) | x = 2 to 60 (BH) | x = 2 to 35 (BH) | x = 2 to 20 (BH and AH) |
|  | x = 2 to 40 (AH) | x = 2 to 30 (AH) | x = 2 to 25 (AH) |  |
| $Ti_xNb_{1-x}$ | x = 2 to 95 (AH) | x = 2 to 93 (AH) | x = 3 to 92 (AH) | x = 5 to 90 (AH) |
| $Ti_xNb_{1-x}$ nitride | x = 1 to 65 | x = 1 to 50 | x = 1 to 40 | x = 1 to 30 |
| $Nb_xZr_{1-x}$ | x = 1 to 80 (BH) | x = 1 to 70 (BH) | x = 1 to 60 (BH) | x = 1 to 50 (BH) |
|  | x = 60 to 100 (AH) | x = 70 to 100 (AH) | x = 80 to 100 (AH) | x = 85 to 100 (AH) |
| $Ta_xW_{1-x}$ | x = 2 to 95 (BH) | x = 2 to 80 (BH) | x = 3 to 60 (BH) | x = 5 to 50 (BH) |
| $W_xNb_{1-x}$ | x = 5 to 100 (BH) | x = 6 to 90 (BH) | x = 8 to 80 (BH) | x = 10 to 70 (BH) |
|  | x = 2 to 50 (AH) | x = 2 to 45 (AH) | x = 2 to 40 (AH) | x = 2 to 30 (AH) |
| $W_xNb_{1-x}$ nitride | x = 2 to 90 (BH) | x = 5 to 80 (BH) | x = 7 to 75 (BH) | x = 10 to 70 (BH) |
|  | x = 2 to 70 (AH) | x = 10 to 70 (AH) | x = 20 to 70 (AH) | x = 30 to 70 (AH) |
| $Zn_xTi_{1-x}$ | x = 10 to 100 (BH) | x = 10 to 80 (BH) | x = 10 to 70 (BH) | x = 10 to 60 (BH) |
|  | x = 20 to 100 (AH) | x = 40 to 97 (AH) | x = 50 to 94 (AH) | x = 60 to 90 (AH) |

The coating 30 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the coating 30 can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750. In the MSVD method, an oxide of a metal or metal alloy can be deposited by sputtering a metal or metal alloy containing cathode in an oxygen containing atmosphere to deposit a metal oxide or metal alloy oxide film on the surface of the substrate. In one embodiment, the coating 30 is deposited over all or substantially all of the surface, i.e., is not deposited to form discrete coated areas. The at least one coating 30 can be deposited over a flat substrate and then the substrate can be bent of shaped in any conventional manner, such as by heating. Alternatively, the at least one coating 30 can be deposited over a curved surface, i.e., a substrate that has already been bent or shaped.

The invention is directed at a coating stack that has an adequately thick total silver to provide a visible light reflectance in the range of 8% to 50%, preferably 8% to 30%, more preferably 8% to 20%, most preferably 9% to 18% and an RgL* of 35 to 55, preferably 42 to 54, more preferably 46 to 53, or most preferably 50 to 52 to produce a neutral color.

In one non-limiting practice of the invention, the coating provides a visible light reflectance of not more than 50%. For example, not more than 30%, such as not more than 20%, such as not more than 18%. As will be appreciated by one skilled in the art, for laminated articles, the reflectance is typically defined with respect to the exterior reflectance of the laminated article. By "exterior reflectance" is meant the reflectance of the exterior surface (No. 1 surface 14), with the coating 30 provided on an interior surface, such as the No. 2 surface 16 or No. 3 surface 20.

In one non-limiting practice of the invention, the coating 30 provides an exterior reflected L* at an 8 degree angle (Rg8L*) has a range of 35 to 55, preferably 40 to 54, more preferably 46 to 53, or most preferably 50 to 52. In one non-limiting practice of the invention, the coating 30 provides an exterior reflected color within the color space with a* at an 8 degree angle (Rg8a*) in the range of 0 to −10. For example, in the range of −1 to −8, preferably −1.2 to −7.0, more preferably −1.5 to −6.8, or most preferably −1.7 to −5.0. In one non-limiting practice of the invention, the coating 30 provides an exterior reflected b* at an 8 degree angle (Rg8b*) in the range of 1 to −20. For example, in the range of 0 to −19, preferably −2.0 to −10, more preferably −10 to −20, or most preferably −15 to −19.

As will be appreciated by one of skill in the art, the color of an object, and in particular glass, is highly subjective. Observed color will depending on the lighting conditions and preferences of the observer. In order to evaluate color on a quantitative basis, several color order systems have been developed. One such method for specifying color adopted by the International Commission on Illumination (CIE) uses dominant wavelength (DW) and excitation purity (Pe). The numerical values of these two specifications for a given color can be determined by calculating the color coordinates x and y from the so-called tristimulus values X, Y, Z of that color. The color coordinates are then plotted on a 1931 CIE chromaticity diagram and numerically compared with the coordinates of CIE standard illuminant C, as identified in CIE publication No. 15.2. This comparison provides a color space position on the diagram to ascertain the excitation purity and dominant wavelength of the glass color.

In another color order system, the color is specified in terms of hue and lightness. This system is commonly referred to as the CIELAB color system. Hue distinguishes colors such as red, yellow, green and blue. Lightness, or value, distinguishes the degree of lightness or darkness. The numerical values of these characteristics, which are identified as $L^*$, $a^*$ and $b^*$, are calculated from the tristimulus values (X, Y, Z). $L^*$ indicates the lightness or darkness of the color and represents the lightness plane on which the color resides. $a^*$ indicates the position of the color on a red ($+a^*$) green ($-a^*$) axis. $b^*$ indicates the color position on a yellow ($+b^*$) blue ($-b^*$) axis. When the rectangular coordinates of the CIELAB system are converted into cylindrical polar coordinates, the resulting color system is known as the CIELCH color system which specifies color in terms of lightness ($L^*$), and hue angle ($H°$) and chroma ($C^*$). $L^*$ indicates the lightness or darkness of the color as in the CIELAB system. Chroma, or saturation or intensity, distinguishes color intensity or clarity (i.e. vividness vs. dullness) and is the vector distance from the center of the color space to the measured color. The lower the chroma of the color, i.e. the less its intensity, the closer the color is to being a so-called neutral color. With respect to the CIELAB system, $C^* = (a^{*2} + b^{*2})^{1/2}$. Hue angle distinguishes colors such as red, yellow, green and blue and is a measure of the angle of the vector extending from the $a^*$, $b^*$ coordinates through the center of the CIELCH color space measured counterclockwise from the red ($+a^*$) axis.

It should be appreciated that color may be characterized in any of these color systems and one skilled in the art may calculate equivalent DW and Pe values; $L^*$, $a^*$, $b^*$ values; and $L^*$, $C^*$, $H°$ values from the transmittance curves of the viewed glass or composite transparency. A detailed discussion of color calculations is given in U.S. Pat. No. 5,792, 559. In the present document, color is characterized using the CIELAB system ($L^*$ $a^*$ $b^*$). However, it is to be understood that this is simply for ease of discussion and the disclosed colors could be defined by any conventional system, such as those described above.

Figure 2:
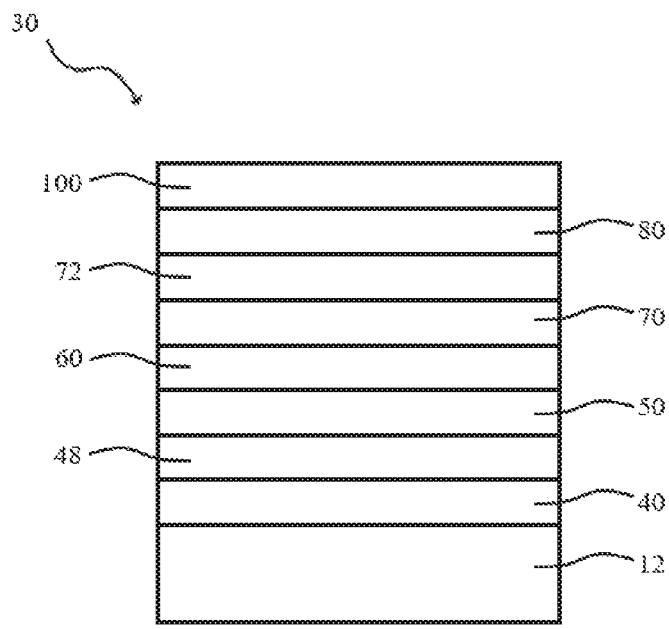
FIG. 2 is a cross-sectional view (not to scale) of a non-limiting coating according to the invention.
Figure 3:
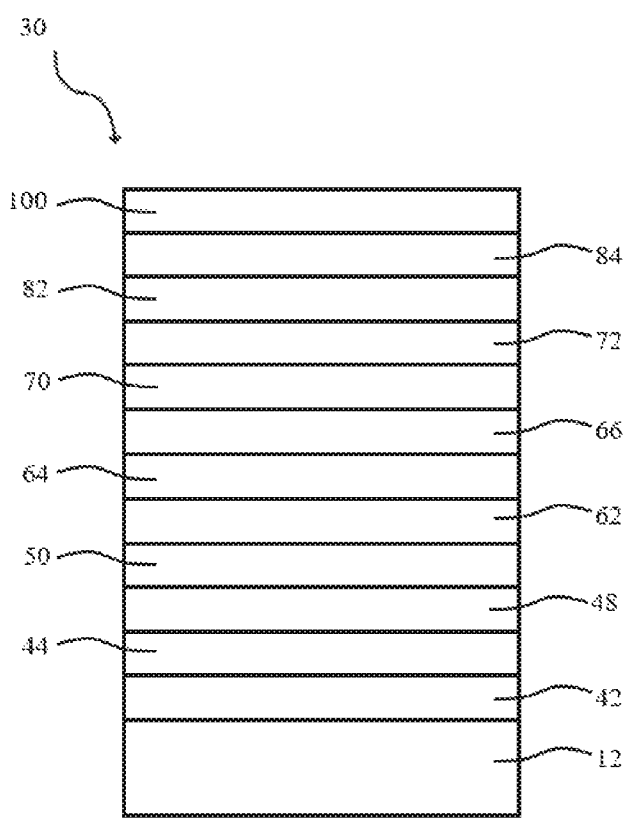
FIG. 3 is a cross-sectional view (not to scale) of a non-limiting coating according to the invention.

Exemplary non-limiting coatings 30 suitable for the invention are shown in FIGS. 2 and 3. This exemplary coating 30 includes two metallic layers positioned in between dielectric layers. It includes a base layer or a first dielectric layer 40 positioned over or in direct contact with at least a portion of a major surface of a substrate (e.g., the No. 2 surface 16 of the first ply 12, or the No. 3 surface 20 of the second ply 18). A first metallic layer 48 is positioned over or in direct contact with at least a portion of the first dielectric layer 40. A first primer layer 50 is positioned over or in direct contact with at least a portion of the first metallic layer 48. A second dielectric layer 60 is positioned over or in direct contact with the first primer layer 50. A second metallic layer 70 is positioned over or in direct contact with at least a portion of the second dielectric layer 60. A second primer layer 72 may be positioned over or in direct contact with the second metallic layer 70. A third dielectric layer 80 is positioned over or in direct contact with the second primer layer 72. An outermost protective layer 100 may be positioned over or in direct contact with the third dielectric layer 80.

The dielectric layers can comprise one or more films of antireflective materials and/or dielectric materials, such as, but not limited to metal oxides, oxides of metal alloys, nitrides, oxynitrides, or mixtures thereof. The first dielectric layer 40 can be transparent to visible light. Examples of suitable metal oxides for the first dielectric layer 40 include oxides of titanium, hafnium, zirconium, niobium, zinc, bismuth, lead, indium, tin, magnesium, gallium, vanadium, aluminum, silicon, alloys thereof, mixtures thereof, or combinations thereof. These metal oxides can have small amount of other materials, such as manganese in bismuth oxide, tin in indium oxide, etc. Alternatively, oxides or metal alloys or metal mixtures, such as oxides containing zinc and tin (e.g., zinc stannate); oxides of indium-tin alloys; silicon nitrides; silicon aluminum nitrides; or aluminum nitrides can be used. Further, doped metal oxides, such as aluminum-doped zinc oxide, antimony-doped tin oxide, nickel or boron-doped silicon oxides, gallium-doped zinc oxide, indium-doped zinc oxide, magnesium-doped zinc oxide, vanadium-doped zinc oxide, indium-doped tin oxides, or mixtures thereof can be used. In one non-limiting embodiment, the first film of the first dielectric layer 42 can be a zinc/tin alloy oxide formed over at least a portion of the substrate (e.g., the No. 2 surface 16 of the first ply 12, or the No. 3 surface 20 of the second ply 18). The zinc/tin alloy oxide can be obtained from MSVD from a cathode of zinc and tin that can comprise zinc and tin in proportions of 10 wt. % to 90 wt. % zinc and 90 wt. % to 10 wt. % tin. One suitable metal alloy oxide that can be present in the first film of the first dielectric layer 42 is zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example, where x=2/3, Formula 1 is $Zn_{2/3}Sn_{1/3}O_{4/3}$, which is more commonly described at $Zn_2SnO_4$. A zinc stannate containing film has one or more of the forms of Formula 1 in a predominant amount in the film.

The second film of the first dielectric layer 44 is formed over at least a portion of the first film of the first dielectric layer 42 and can comprise zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, mixtures or combinations thereof. In one non-limiting embodiment, the second film of the first dielectric layer 44 can be a zinc-containing film, such as zinc oxide. The zinc oxide film can be deposited from a zinc cathode that includes other materials to improve the sputtering characteristics of the cathode. For example, the zinc cathode can include a small amount (e.g., less than 10 wt. %, such as greater than 0 to 5 wt. %) of tin to improve sputtering. In which case, the resultant zinc oxide film would include a small percentage of tin oxide, e.g., 0 to less than 10 wt. % tin oxide, e.g., 0 to 5 wt. % tin oxide. An oxide layer sputtered from a zinc/tin cathode having 95 wt. % zinc and 5 wt. % tin, or preferably 90 wt. % zinc and 10 wt. % tin, is referred to as a zinc oxide film. The small amount of tin in the cathode (e.g., less than 10 wt. %) is believed to form a small amount of tin oxide in the predominately zinc oxide-containing second film of the first dielectric layer 44.

In an exemplary non-limiting embodiment, the second film 44 is a film consisting of at least one of the following: aluminum-doped zinc oxide, gallium doped-zinc oxide, indium-doped zinc oxide, magnesium-doped zinc oxide, vanadium-doped zinc oxide, or indium-doped tin oxide. The aluminum-doped zinc oxide, gallium doped-zinc oxide, indium-doped zinc oxide, magnesium-doped zinc oxide, vanadium-doped zinc oxide, or indium-doped tin oxide film is deposited from a zinc cathode that includes other materials to improve the sputtering characteristics of the cathode. For example, the aluminum-doped zinc oxide, gallium doped-zinc oxide, indium-doped zinc oxide, magnesium-doped zinc oxide, vanadium-doped zinc oxide, or indium-doped tin oxide film can include a small amount (e.g., less than 10 wt. %, such as greater than 0 to 5 wt. %) of tin to improve sputtering. In which case, the resultant aluminum-doped zinc oxide, gallium doped-zinc oxide, indium-doped zinc oxide, magnesium-doped zinc oxide, vanadium-doped zinc oxide, or indium-doped tin oxide film would include a small percentage of tin oxide, e.g., 0 wt. % to less than 10 wt. % tin oxide, e.g., 0 wt. % to 5 wt. % tin oxide.

One non-limiting embodiment is in which the first film of the first dielectric layer 42 is zinc stannate and the second film of the first dielectric layer 44 comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the first film of the first dielectric layer 42.

The first dielectric layer 40 can have a total thickness in the range of 10 nm to 55 nm, preferably 20 nm to 53 nm, more preferably 25 nm to 50 nm, most preferably 29 nm to 48 nm.

In one non-limiting embodiment, the first dielectric layer 40 comprises a first seed film in direct contact with the first metallic layer 48, not depicted in the figures. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. In one non-limiting embodiment, the seed film can comprise aluminum zinc, vanadium zinc, zinc, silver zinc, metals thereof, alloys thereof, oxides thereof, or sub-oxides thereof. In another embodiment, the seed film can comprise gallium zinc, indium zinc, indium tin, metals thereof, alloys thereof, oxides thereof, or sub-oxides thereof. Compositions of non-limiting examples of the seed film can be found in Table 2. In certain embodiments, a portion of the seed film is formed in an $O_2$ atmosphere that has a specific flow rate as to form an atmosphere of 1% to 70% $O_2$, with the remainder argon. The flow rate is an approximation to the amount of $O_2$ in the atmosphere, but that one of ordinary skill in the art would recognize that additional $O_2$ may leak into the coating chamber as the coating chamber is not hermetically sealed from the outside environment. In one embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the seed film comprises $Sn_xIn_{1-x}$ oxide. In another embodiment, the seed film comprises Ag deposited in an oxygen/argon gas environment. In another embodiment, the seed film comprises $Al_xAg_{1-x}$. In one non-limiting embodiment, the second film of the first dielectric layer 44 is the seed film. In some embodiments, the first dielectric layer 40 comprises a first film 42, a second film 44, and a seed film. The seed film can have a total thickness in the range of 0.5 nm to 10 nm, preferably 0.75 nm to 8 nm, more preferably 0.9 nm to 6 nm.

TABLE 2

Compositions of Metals for Metal Alloys Used as Seed Films

| Material | Range (wt. %) | Preferred Range (wt. %) | More Preferred Range (wt. %) | Most Preferred Range (wt. %) |
|---|---|---|---|---|
| Ag deposited in $O_2$ gas environment | x = 1 to 70% gas flow | x = 1 to 50% gas flow | x = 10 to 40% gas flow | x = 20 to 40% gas flow |
| $Al_xAg_{1-x}$ oxide | x = 1 to 35 (BH and AH) | x = 1 to 20 (BH and AH) | x = 1 to 18 (BH and AH) | x = 1 to 15 (BH and AH) |
| $Al_xZn_{1-x}$ oxide | x = 1 to 25 | x = 1 to 15 | x = 1 to 12 | x = 1 to 10 |
| $Ga_xZn_{1-x}$ oxide | x = 1 to 20 | x = 1 to 15 | x = 1 to 10 | x = 1 to 5 |
| $Sn_xIn_{1-x}$ oxide | x = 1 to 20 | x = 2 to 18 | x = 4 to 15 | x = 5 to 12 |
| $V_xZn_{1-x}$ oxide | x = 1 to 25 | x = 1 to 15 | x = 1 to 10 | x = 1 to 8 |

A first metallic layer 48 can be deposited over at least a portion of the first dielectric layer 40. The first metallic layer 48 can include a reflective metal, such as but not limited to metallic gold, silver, mixtures thereof, alloys thereof, or combinations thereof. In one embodiment, the first metallic layer 48 comprises a metallic silver layer. The first metallic layer 48 can have a total thickness in the range of 5 nm to 20 nm, preferably 7.5 nm to 15 nm, more preferably 9 nm to 14 nm, most preferably 9.7 to 13.3 nm.

A first primer layer 50 may be deposited over at least a portion of the first metallic layer 48. The first primer layer 50 can be an oxygen-capturing material, such as titanium, that can be sacrificial during the deposition process to prevent degradation or oxidation of the first metallic layer 48 during the sputtering process or subsequent heating processes. The oxygen-capturing material can be chosen to oxidize before the material of the first metallic layer 48. Examples of materials suitable for the primer layer include zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, where the primer is deposited as a metal and subsequently oxidized. Examples of suitable materials for the first primer layer 50 can be found in Table 1. At least a portion of the primer layer is a nitride or an oxide. If silver zinc, zinc, silver zinc oxide, titanium, aluminum zinc oxide, indium zinc oxide, gallium zinc oxide, or vanadium zinc oxide is used as the first primer layer 50, it would preferably oxidize before oxidation of the underlying metallic layer. In one embodiment, the first primer layer 50 is titanium. In another embodiment, the first primer layer 50 comprises silver zinc. In another embodiment, the first primer layer 50 comprises zinc. In another embodiment, the first primer layer 50 comprises $Ag_xZn_{1-x}$. In another embodiment, the first primer layer 50 comprises $Ag_xZn_{1-x}$ oxide. In another embodiment, the first primer layer 50 comprises $Al_xZn_{1-x}$ oxide. In another embodiment the first primer layer 50 comprises $In_xZn_{1-x}$ oxide. In another embodiment, the first primer layer 50 comprises $Ga_xZn_{1-x}$ oxide. In another embodiment, the first primer layer 50 comprises $V_xZn_{1-x}$ oxide. In another embodiment, the first primer layer 50 comprises $Al_xTi_{1-x}$ oxide. In another embodiment, the first primer layer 50 comprises $Al_xNb_{1-x}$ oxide. In another embodiment, the first primer layer 50 comprises $Al_xNb_{1-x}$ nitride. In another embodiment, the first primer layer 50 comprises $W_xNb_{1-x}$ nitride. In another embodiment, the first primer layer 50 comprises $W_xTi_{1-x}$ oxide. In another embodiment, the first primer layer 50 comprises $Ti_xTa_{1-x}$ oxide. In another embodiment, the first primer layer 50 comprises $Ti_xNb_{1-x}$ oxide. In another embodiment, the first primer layer 50 comprises $Ti_xNb_{1-x}$ nitride. In another embodiment, the first primer layer 50 comprises $Nb_xZr_{1-x}$ oxide. In another embodiment, the first primer layer 50 comprises $Ta_xW_{1-x}$ oxide. In another embodiment, the first primer layer 50 comprises $W_xNb_{1-x}$ oxide. In another embodiment, the first primer layer 50 comprises $Zn_xTi_{1-x}$ oxide. The first primer layer 50 has a total thickness in the range of 0.5 nm to 10 nm, preferably 1.0 nm to 5.0 nm, more preferably 1.0 to 2.5 nm.

A second dielectric layer 60 can be deposited over at least a portion of the first metallic layer 48 or the optional first primer layer 50. The second dielectric layer 60 can include one or more materials discussed above with respect to the first dielectric layer. In the illustrated non-limiting example of FIG. 2, the second dielectric layer 60 includes a first film of the second dielectric layer 62 deposited over the first metallic layer 48 or the optional first primer layer 50. The first film of the second dielectric layer 62 comprises an oxide, a nitride, an oxynitride, or a mixture thereof of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. In one embodiment the first film of the second dielectric layer 62 comprises zinc oxide. In another embodiment, the first film of the second dielectric layer 62 comprises aluminum-doped zinc oxide. In another embodiment, the first film of the second dielectric layer 62 comprises indium-doped zinc oxide. In another embodiment, the first film of the second dielectric layer 62 comprises gallium-doped zinc oxide. In another embodiment, the first film of the second dielectric layer 62 comprises indium-doped tin oxide. In another embodiment, the first film of the second dielectric layer 62 comprises vanadium-doped zinc oxide.

The second film of the second dielectric layer 64 can be deposited over at least a portion of the first film of the second dielectric layer 62. The second film of the second dielectric layer 64 comprises an oxide, a nitride, an oxynitride, or a mixture therefore of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. In one non-limiting embodiment, the second film of the second dielectric layer 64 is zinc stannate.

A third film of the second dielectric layer 66 can be deposited over at least a portion of the second film of the second dielectric layer 64. The third film of the second dielectric layer 66 can comprise comprises an oxide, a nitride, an oxynitride, or a mixture therefore of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. The third film of the second dielectric layer 66 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the third film of the second dielectric layer 66 comprises zinc oxide. In another embodiment, the third film of the second dielectric layer 66 comprises indium-doped zinc oxide. In another embodiment, the third film of the second dielectric layer 66 comprises gallium-doped zinc oxide. In another embodiment, the third film of the second dielectric layer 66 comprises indium-doped tin oxide. In another embodiment, the third film of the second dielectric layer 66 comprises vanadium-doped zinc oxide. In another embodiment, the first dielectric layer 40 or the second dielectric layer 60 comprises a silicon nitride film.

One non-limiting embodiment is in which the first film of the second dielectric layer 62 comprises zinc oxide, the second film of the second dielectric layer 64 comprises zinc stannate, and the third film of the second dielectric layer 66 comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the second film of the second dielectric layer 44.

The second dielectric layer 60 can have a total thickness in the range of 50 nm to 150 nm, preferably 75 nm to 125 nm, more preferably 90 nm to 110 nm, most preferably 93 nm to 100 nm.

In one non-limiting embodiment, the second dielectric layer 60 comprises a seed film positioned in direct contact with the second metallic layer 70. The seed film can include one or more materials discussed above with respect to the seed film of the first dielectric layer and Table 2. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. In one non-limiting embodiment, the seed film can comprise aluminum zinc, vanadium zinc, zinc, silver zinc, metals thereof, alloys thereof, oxides thereof, or sub-oxides thereof. In another embodiment, the seed film can comprise gallium zinc, indium zinc, indium tin, metals thereof, alloys thereof, oxides thereof, or sub-oxides thereof. In one embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the seed film comprises $Sn_xIn_{1-x}$ oxide. In another embodiment, the seed film comprises Ag deposited in an oxygen/argon gas environment. In another embodiment, the seed film comprises $Al_xAg_{1-x}$. In some embodiments, the second dielectric layer 60 has a first film 62, a second film 64, and a seed film. In some embodiments, the second dielectric layer 60 has a first film 62, a second film 64, a third film 66, and a seed film. The seed film can have a total thickness in the range of 0.5 nm to 10 nm, preferably 0.75 nm to 8 nm, more preferably 0.9 nm to 6 nm.

A second metallic layer 70 can be deposited over at least a portion of the second dielectric layer 60. The second metallic layer 70 can include any one or more of the reflective materials described above with respect to the first metallic layer 48. In one non-limiting embodiment, the second metallic layer 70 comprises silver. The second metallic layer 70 can have a total thickness in the range of 5 nm to 20 nm, preferably 5 nm to 15 nm, more preferably 7.5 nm to 12.5 nm, most preferably 7.5 nm to 10.3 nm.

A second primer layer 72 can be deposited over at least a portion of the second metallic layer 70. The second primer layer 72 can be any of the materials described above with respect to the first primer layer 50 and Table 1. In one non-limiting embodiment, the second primer layer 72 comprises titanium. In another embodiment, the second primer layer 72 comprises silver zinc. In another embodiment, the second primer layer 72 comprises zinc. In another embodiment, the second primer layer 72 comprises $Ag_xZn_{1-x}$. In another embodiment, the second primer layer 72 comprises $Ag_xZn_{1-x}$ oxide. In another embodiment, the second primer layer 72 comprises $Al_xZn_{1-x}$ oxide. In another embodiment, the second primer layer 72 comprises $In_xZn_{1-x}$ oxide. In another embodiment, the second primer layer 72 comprises $Ga_xZn_{1-x}$ oxide. In another embodiment, the second primer layer 72 comprises $V_xZn_{1-x}$ oxide. In another embodiment, the second primer layer 72 comprises $Al_xTi_{1-x}$ oxide. In another embodiment, the second primer layer 72 comprises $Al_xNb_{1-x}$ oxide. In another embodiment, the second primer layer 72 comprises $Al_xNb_{1-x}$ nitride. In another embodiment, the second primer layer 72 comprises $W_xNb_{1-x}$ nitride. In another embodiment, the second primer layer 72 comprises $W_xTi_{1-x}$ oxide. In another embodiment, the second primer layer 72 comprises $Ti_xTa_{1-x}$ oxide. In another embodiment, the second primer layer 72 comprises $Ti_xNb_{1-x}$ oxide. In another embodiment, the second primer layer 72 comprises $Ti_xNb_{1-x}$ nitride. In another embodiment, the second primer layer 72 comprises $Nb_xZr_{1-x}$ oxide. In another embodiment, the second primer layer 72 comprises $Ta_xW_{1-x}$ oxide. In another embodiment, the second primer layer 72 comprises $W_xNb_{1-x}$ oxide. In another embodiment, the second primer layer 72 comprises $Zn_xTi_{1-x}$ oxide. The second primer layer 72 has a total thickness in the range of 0.5 nm to 10 nm, preferably 1.0 nm to 5 nm, more preferably 1.0 nm to 2.5 nm.

A third dielectric layer 80 can be deposited over at least a portion of the second metallic layer 70 or the second primer layer 72. The third dielectric layer 80 can also include one or more materials discussed above with respect to the first and second dielectric layers. In one non-limiting embodiment, the third dielectric layer 80 comprises a first film of the third dielectric layer 82. The first film of the third dielectric layer 82 comprises an oxide, a nitride, an oxynitride, or a mixture therefore of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. In one embodiment, the first film of the third dielectric layer 82 comprises zinc oxide. In another non-limiting embodiment, the first film of the third dielectric layer 82 comprises zinc stannate. In another embodiment, the first film of the third dielectric layer 82 comprises aluminum-doped zinc oxide. In another embodiment, the first film of the third dielectric layer 82 comprises indium-doped zinc oxide. In another embodiment, the first film of the third dielectric layer 82 comprises gallium-doped zinc oxide. In another embodiment, the first film of the third dielectric layer 82 comprises indium-doped tin oxide. In another embodiment, the first film of the third dielectric layer 82 comprises vanadium-doped zinc oxide.

A second film of the third dielectric layer 84 can be deposited over at least a portion of the first film of the third dielectric layer 82. The second film of the third dielectric layer 84 comprises an oxide, a nitride, an oxynitride, or a mixture thereof of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. The second film of the third dielectric layer 84 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the second film of the third dielectric layer 84 comprises zinc oxide. In one embodiment, the second film of the third dielectric layer 84 comprises zinc stannate. In another embodiment, the second film of the third dielectric layer 84 comprises silicon nitride or silicon oxynitride. In another embodiment, the second film of the third dielectric layer 84 comprises indium-doped zinc oxide. In another embodiment, the second film of the third dielectric layer 84 comprises gallium-doped zinc oxide. In another embodiment, the second film of the third dielectric layer 84 comprises indium-doped tin oxide. In another embodiment, the second film of the third dielectric layer 84 comprises vanadium-doped zinc oxide.

An optional third film of the third dielectric layer can be deposited over at least a portion of the second film of the third dielectric layer 84. The optional third film of the third dielectric layer can comprise an oxide, a nitride, an oxynitride, or a mixture thereof of a metal selected from the group consisting of titanium, hafnium, zirconium, niobium, zinc, bismuth, lead, indium, tin, silicon, magnesium, gallium, vanadium, aluminum, alloys thereof, mixtures thereof, or combinations thereof. The third film of the third dielectric layer can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one non-limiting embodiment, the optional third film of the third dielectric layer comprises zinc oxide. In another embodiment, the third film of the third dielectric layer comprises indium-doped zinc oxide. In another embodiment, the third film of the third dielectric layer comprises gallium-doped zinc oxide. In another embodiment, the third film of the third dielectric layer comprises indium-doped tin oxide. In another embodiment, the third film of the third dielectric layer comprises vanadium-doped zinc oxide. In another embodiment, the optional third film of the third dielectric layer comprises silicon nitride or silicon oxynitride. In another embodiment, the optional third film of the third dielectric layer comprises titanium oxide.

One non-limiting embodiment is in which the first film of the third dielectric layer 82 comprises zinc oxide or zinc stannate, and the second film of the third dielectric layer 84 comprises zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the first film of the third dielectric layer 82.

The third dielectric layer 80 can have a total thickness in the range of 20 nm to 75 nm, preferably 25 nm to 50 nm, more preferably 30 nm to 45 nm, most preferably 36 nm to 41 nm.

In one non-limiting embodiment, the coated article comprises a first and a second metallic layer 48, 70. There are no additional metallic layers in the coated article. The metallic layers may include only silver or only silver and gold.

Each metallic layer has a thickness. In one non-limiting embodiment, the total combined thickness of the metallic layers is in the range of 10 nm to 30 nm, preferably 12 nm to 25 nm, most preferably 15 nm to 22 nm, most preferably 16 nm to 18 nm.

The coating can include an outermost protective layer 100, which, for example in the non-limiting embodiment shown in FIG. 2, is deposited over at least a portion of the third dielectric layer 80, to assist in protecting the underlying layers, such as the metallic layers, from mechanical and chemical attack during processing. The outermost protective layer 100 can be an oxygen barrier coating layer to prevent or reduce the passage of ambient oxygen into the underlying layers of the coating 30, such as during heating or bending. The outermost protective layer 100 can be of any desired material or mixture of materials and can be comprised of one or more protective films. In one exemplary embodiment, the outermost protective layer 100 can include a single layer comprising one or more metal oxide materials, such as but not limited to oxides of aluminum, silicon, or mixtures thereof. For example, the outermost protective coating 100 can be a single coating layer comprising in the range of 0 wt. % to 100 wt. % alumina and/or 100 wt. % to 0 wt. % silica, such as 5 wt. % to 95 wt. % alumina and 95 wt. % to 5 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. % alumina and 50 wt. % to 30 wt. % silica, such as 35 wt. % to 100 wt. % alumina and 65 wt. % to 0 wt. % silica, such as 70 wt. % to 90 wt. % alumina and 30 wt. % to 10 wt. % silica, e.g., 75 wt. % to 85 wt. % alumina and 25 wt. % to 15 wt. % silica, e.g., 88 wt. % alumina and 12 wt. % silica, e.g., 65 wt. % to 75 wt. % alumina and 35 wt. % to 25 wt. % silica, e.g., 70 wt. % alumina and 30 wt. % silica, e.g., 60 wt. % to less than 75 wt. % alumina and greater than 25 wt. % to 40 wt. % silica. Other materials, such as aluminum, chromium, hafnium, yttrium, nickel, boron, phosphorous, titanium, zirconium, and/or oxides thereof can also be present, such as to adjust the refractive index of the outermost protective layer 100. In one non-limiting embodiment, the refractive index of the outermost protective layer 100 can be in the range of 1 to 3, such as 1 to 2, such as 1.4 to 2, such as 1.4 to 1.8.

In one non-limiting embodiment, the protective later 100 is a combination silica and alumina coating. The outermost protective layer 100 can be sputtered from two cathodes (e.g., one silicon and one aluminum) or from a single cathode containing both silicon and aluminum. This silicon aluminum oxide outermost protective layer 100 can be written as $Si_xAl_{1-x}O_{(1.5+x)/2}$, where x can vary from greater than 0 to less than 1. In one exemplary embodiment, the outermost protective layer 100 comprises 15 wt. % alumina and 85 wt. % silica. In another embodiment, the outermost protective coating 100 comprises $SiO_2$, $Al_2O_3$, SiAlO, alloys thereof, and mixtures thereof.

In one non-limiting embodiment, the outermost protective layer 100 may be comprised of silicon nitride ($Si_3N_4$), silicon oxynitride (SiON), silicon aluminum nitride (SiAlN), silicon aluminum oxynitride (SiAlON), a mixture thereof, and/or an alloy thereof and which may provide increased durability to the coated article. The outermost protective layer 100 may be formed of silicon nitride deposited with other materials having superior electrical conductivity to improve sputtering of the silicon. For example, during deposition, the silicon cathode can include a small amount (e.g., up to 20 wt. %, up to 15 wt. %, up to 10 wt. %, or up to 5 wt. %) of aluminum to improve sputtering. In which case, the resultant silicon nitride layer would include a small percentage of aluminum, e.g., up to 15 wt. % aluminum, e.g., up to 10 wt. % aluminum, e.g., up to 5 wt. % aluminum. A coating layer deposited from a silicon cathode having up to 10 wt. % aluminum (added to enhance the conductivity of the cathode) is referred to herein as a "silicon nitride" layer, even though a small amount of aluminum may be present. The small amount of aluminum in the cathode (e.g., less than or equal to 15 wt. %, such as less than or equal to 10 wt. %, such as less than or equal to 5 wt. %) is believed to form aluminum nitride in the predominately silicon nitride outermost protective layer 100. The outermost protective layer 100 may be formed in a nitrogen atmosphere; however, it is to be understood that other gasses, such as oxygen, may be present in the atmosphere during the deposition of the outermost protective layer 100.

In another non-limiting embodiment, the outermost protective layer 100 can be a multilayer coating comprising a first protective film and a second protective film formed over at least a portion of the first protective film. The first protective film can comprise alumina, silica, titania, zirconia, tin oxide, mixtures thereof, or an alloy thereof. In one specific non-limiting embodiment, the first protective film can comprise alumina or an alloy comprising alumina and silica. For example, the first protective film can comprise a silica/alumina mixture having greater than 5 wt. % alumina, such as greater than 10 wt. % alumina, such as greater than 15 wt. % alumina, such as 50 wt. % to 70 wt. % alumina, such as in the range of 60 wt. % to 100 wt. % alumina and 40 wt. % to 0 wt. % silica, e.g., 60 wt. % alumina and 40 wt. % silica. In another example, the first protective film can comprise zinc stannate. In another example, the first protective film can comprise zirconia.

The second protective film may comprise, for example, a metal oxide or metal nitride. The second protective film can be titania, alumina, silica, zirconia, tin oxide, a mixture thereof, or an alloy thereof. For example, the second protective film can comprise a titania/alumina mixture having 40-60 wt. % alumina and 60-40 wt. % titania; 45-55 wt. % alumina and 55-45 wt. % titania; 48-52 wt. % alumina and 52-48 wt. % titania; 49-51 wt. % alumina and 51-49 wt. % titania; or 50 wt. % alumina and 50 wt. % titania. An example of the second protective film may include titanium aluminum oxide (TiAlO). Another example of the second protective film is a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina.

In non-limiting examples, the outermost protective layer 100 may include an additional third protective film formed over at least a portion of the second protective film. The third protective film can be any of the materials used to form the first and second protective films. The third protective film, for example, can comprise alumina, silica, titania, zirconia, tin oxide, or mixtures thereof. For example, the third protective film can comprise a mixtures of silica and alumina. In another example, the third protective film comprises alumina and titania. In another example, the third protective film comprises zirconia.

The outermost protective layer 100 is the outermost layer of the coated article. Further, the outermost protective layer 100 can be of non-uniform thickness. By "non-uniform thickness" is meant that the thickness of the outermost protective layer 100 can vary over a given unit area, e.g., the outermost protective layer 100 can have high and low spots or areas. Non-limiting examples of suitable protective layers are described in U.S. patent application Ser. Nos. 10/007,382; 10/133,805; 10/397,001; 10/422,095; and Ser. No. 10/422,096.

The outermost protective layer 100 can have a total thickness in the range of 20 nm to 120 nm, preferably 25 nm to 110 nm, more preferably 30 nm to 100 nm, most preferably 35 nm to 90 nm.

The invention is further described in the following numbered clauses:

Clause 1. A coated article comprising a substrate; a functional coating applied over at least a portion of the substrate, the functional coating comprising a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; and a third dielectric layer over at least a portion of the second primer layer; wherein the coated article has a RgL* value is at least 35, and no more than 55.

Clause 2. The coated article of clause 1, wherein the RgL* value is at least 42.

Clause 3. The coated article of clause 1, wherein the RgL* value is no more than 52.

Clause 4. The coated article of any of the preceding clauses, wherein at least one of the metallic layers comprises at least one of silver, gold, mixtures thereof, or alloys thereof.

Clause 5. The coated article of any of the preceding clauses, wherein at least one of the metallic layers comprise metallic silver.

Clause 6. The coated article of any of the preceding clauses, wherein the first metallic layer comprises a total thickness of 5 nm to 20 nm, preferably 7.5 nm to 15 nm, more preferably 9 nm to 14 nm, most preferably 9.7 nm to 13.3 nm.

Clause 7. The coated article of any of the preceding clauses, wherein the second metallic layer comprises a total thickness of 5 nm to 20 nm, preferably 5 nm to 15 nm, more preferably 7.5 nm to 12.5 nm, most preferably 7.5 nm to 10.3 nm.

Clause 8. The coated article of clause 1, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof.

Clause 9. The coated article of clause 1, wherein the first dielectric layer comprises a first film over at least a portion of the substrate comprising zinc stannate, and a second film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the first film.

Clause 10. The coated article of clause 9, wherein the second film comprises aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof.

Clause 11. The coated article of clauses 8 to 10, wherein the first dielectric layer comprises a total thickness of 10 nm to 55 nm, preferably 20 to 53 nm, more preferably 25 to 50 nm, most preferably 29 to 48 nm.

Clause 12. The coated article of any of the preceding clauses, wherein the first dielectric layer comprises a seed film in direct contact with the first metallic layer, wherein the seed film comprises aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 13. The coated article of any of the preceding clauses, wherein the second dielectric layer comprises a first film comprising zinc oxide over at least a portion of the first primer layer, a second film comprising zinc stannate over at least a portion of the first film, and a third film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the second film.

Clause 14. The coated article of clause 13, wherein the second dielectric layer comprises a total thickness of 50 nm to 150 nm, preferably 75 nm to 125 nm, more preferably 90 nm to 110 nm, most preferably 93 nm to 100 nm.

Clause 15. The coated article of any of the preceding clauses, wherein the second dielectric layer comprises a seed film in direct contact with the second metallic layer, wherein the seed film comprises aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 16. The coated article of any of the preceding clauses, wherein the third dielectric layer comprises a first film comprising zinc oxide or zinc stannate over at least a portion of the second primer layer, and a second film comprising zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the first film.

Clause 17. The coated article of clause 16, wherein the third dielectric layer comprises a total thickness of 20 nm to 75 nm, preferably 25 nm to 50 nm, more preferably 30 nm to 45 nm, most preferably 36 nm to 41 nm.

Clause 18. The coated article of any of the preceding clauses, further comprising an outermost protective coating comprising a protective layer, wherein the protective layer comprises at least one of $Si_3N_4$, SiAlN, SiAlON, titania, alumina, silica, zirconia, alloys thereof, mixtures thereof, or combinations thereof.

Clause 19. The coated article of clause 18, wherein the protective layer comprises a total thickness of 20 nm to 120 nm, preferably 25 m to 110 nm, more preferably 30 nm to 100 nm, most preferably 35 nm to 90 nm.

Clause 20. The coated article of any of clauses 18 to 19, wherein the protective layer comprises a first protective film and a second protective film formed over at least a portion of the first protective film.

Clause 21. The coated article of any of clauses 18 to 20, wherein the protective layer comprises silicon aluminum oxide, titanium aluminum oxide, mixtures thereof, or combinations thereof.

Clause 22. The coated article of any of the preceding clauses, wherein at least one of the first primer layer or the second primer layer is selected from the group consisting of zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, and wherein the primer is deposited as a metal and subsequently oxidized.

Clause 23. The coated article of clause 22, wherein the first primer layer comprises a total thickness of 0.5 nm to 10 nm, preferably 1.0 nm to 5 nm, more preferably 1.0 nm to 2.5 nm.

Clause 24. The coated article of clause 22, wherein the second primer layer comprises a total thickness of 0.5 nm to 5 nm, preferably 1 nm to 2.5 nm, more preferably 1.5 nm to 2.5 nm.

Clause 25. A coated article comprising a substrate; a functional coating applied over at least a portion of the substrate, the functional coating comprising a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; and a third dielectric layer over at least a portion of the second primer layer, wherein the total combined thickness of the metallic layers is at least 10 nanometers, and no more than 30 nanometers.

Clause 26. The coated article of clause 25, wherein the total combined thickness of the metallic layers is not more than 22 nanometers.

Clause 27. The coated article of clause 26, wherein the total combined thickness of the metallic layers is no more than 18 nanometers.

Clause 28. The coated article of any of clauses 25 to 27, wherein at least one of the metallic layers comprises at least one of silver, gold, alloys thereof, mixtures thereof, or combinations thereof.

Clause 29. The coated article of any of clauses 25 to 28, wherein at least one of the metallic layers comprise metallic silver.

Clause 30. The coated article of clause 25, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof.

Clause 31. The coated article of any of clauses 25 to 30, wherein the first dielectric layer comprises a first film comprising zinc stannate, zinc oxide, silicon nitride, or mixture thereof over at least a portion of the substrate, and a second film comprising zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the first film.

Clause 32. The coated article of any of clauses 25 to 31, wherein the first dielectric layer comprises a seed film in direct contact with the first metallic layer, wherein the seed film comprises aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 33. The coated article of any of clauses 25 to 31, wherein the second dielectric layer comprises a first film comprising zinc oxide over at least a portion of the first primer layer, a second film comprising zinc stannate over at least a portion of the first film, and a third film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the second film.

Clause 34. The coated article of clauses 25 to 33, wherein the second dielectric layer comprises a seed film in direct contact with the second metallic layer, wherein the seed film comprises aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 35. The coated article of clauses 25 to 34, wherein the third dielectric layer comprises a first film comprising zinc oxide or zinc stannate over at least a portion of the second primer layer, and a second film comprising zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide, alloys thereof, mixtures thereof, or combinations thereof over at least a portion of the first film.

Clause 36. The coated article of any of clauses 25 to 35, further comprising an outermost protective coating comprising a protective layer, wherein the protective layer comprises at least one of $Si_3N_4$, SiAlN, SiAlON, titania, alumina, silica, zirconia, alloys thereof, mixtures thereof, or combinations thereof.

Clause 37. The coated article of clause 36, wherein the protective layer comprises a first protective film and a second protective film formed over the first protective film.

Clause 38. The coated article of any of clauses 36 to 37, wherein the protective layer comprises silicon aluminum oxide, titanium aluminum oxide, alloys thereof, mixtures thereof, or combinations thereof.

Clause 39. The coated article of any of clauses 25 to 38, wherein at least one of the first primer layer or the second primer layer is selected from the group consisting of zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, or alloys thereof, and wherein the primer is deposited as a metal and subsequently oxidized.

Clause 40. A method of making a coated article comprising providing a substrate; and applying a functional coating over at least a portion of the substrate, wherein the applying the functional coating step comprises: forming a first dielectric layer over at least a portion of the substrate; forming a first metallic layer over at least a portion of the first dielectric layer; forming a first primer layer over at least a portion of the first metallic layer; forming a second dielectric layer over at least a portion of the first primer layer; forming a second metallic layer over at least a portion of the second dielectric layer; forming a second primer layer over at least a portion of the second metallic layer; and forming a third dielectric layer over at least a portion of the second primer layer, wherein the total combined thickness of the metallic layers is at least 10 nanometers, and no more than 30 nanometers, and wherein the RgL* value is at least 35, and no more than 55.

Clause 41. The method of clause 40, wherein applying an outermost protective coating comprising forming a protective layer, wherein the protective layer comprises at least one of $Si_3N_4$, SiAlN, SiAlON, titania, alumina, silica, zirconia, alloys thereof, mixtures thereof, or combinations thereof.

The following Examples illustrate various embodiments of the invention. However, it is to be understood that the invention is not limited to these specific embodiments.

EXAMPLES

Table 3 shows exemplary coating compositions of the invention. The reported thickness are geometric thickness in nanometers (nm), unless otherwise noted. The substrate is a clear glass substrate with a thickness of 2.1 mm with a 2.1 mm clear cover. The base layer is the first dielectric layer, the center layer is the second dielectric layer, and the top layer is the third dielectric layer.

TABLE 3

| Sample | 1 | 2 | 3 | 4 |
|---|---|---|---|---|
| Glass Substrate | 2.1 mm | 2.1 mm | 2.1 mm | 2.1 mm |
| Glass Cover | 2.1 mm | 2.1 mm | 2.1 mm | 2.1 mm |
| Base | 37 | 29.7 | 32.6 | 47.2 |
| 1st Metallic Layer | 13.3 | 10.6 | 9.7 | 9.9 |
| Center | 99.6 | 94.9 | 93.1 | 94.8 |
| 2nd Metallic Layer | 7.9 | 7.6 | 7.5 | 10.3 |
| Top | 39.6 | 40.2 | 39.0 | 36.8 |
| Protective Layer | 51 | 51 | 51 | 51 |
| Total Metallic | 21.2 | 18.1 | 17.2 | 20.2 |

Table 4 shows the resulting color and optical properties, for the Samples of Table 3. For an article containing a substrate and a cover (laminate), R1 refers to the reflectance from the exterior surface closest to the coating and R2 refers to the reflectance from the exterior surface farthest from the coating.

TABLE 4

| | Rg8 | | | | Rg8 Matrix | Rg60 Matrix | T | R1 | R2 | Resistance |
|---|---|---|---|---|---|---|---|---|---|---|
| Sample | L* | a* | b* | LTA | Sensitivity | Sensitivity | solar | solar | solar | (Ω/s) |
| 1 | 51.9 | −2.3 | −7.9 | 71.8 | 0.9 | 0.7 | 41.0 | 31.3 | 37.9 | 1.7 |
| 2 | 45.2 | −2.3 | −8.0 | 77.0 | 0.8 | 0.6 | 45.9 | 26.9 | 32.5 | 2.8 |
| 3 | 41.9 | −1.9 | −7.5 | 79.1 | 0.7 | 0.5 | 47.9 | 25.1 | 30.3 | 2.9 |
| 4 | 42.4 | −3.3 | −18.0 | 79.0 | 0.8 | 0.7 | 44.6 | 28.9 | 33.2 | 2.4 |

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. A coated article comprising:
    a substrate; and
    a functional coating applied over at least a portion of the substrate, the functional coating comprising:
        a first dielectric layer in direct contact with at least a portion of the substrate, wherein the first dielectric layer consists of a first film in direct contact with at least a portion of the substrate and a second film in direct contact with at least a portion of the first film, wherein the first film of the first dielectric layer comprises zinc stannate or tin oxide;
        a first reflective metallic layer in direct contact with at least a portion of the first dielectric layer;

a first primer layer in direct contact with at least a portion of the first metallic layer;

a second dielectric layer in direct contact with at least a portion of the first primer layer, wherein the second dielectric layer consists of a first film in direct contact with at least a portion of the first primer layer, a second film in direct contact with at least a portion of the first film, and a third film in direct contact with at least a portion of the second film;

a second reflective metallic layer in direct contact with at least a portion of the second dielectric layer;

a second primer layer in direct contact with at least a portion of the second metallic layer; and a third dielectric layer in direct contact with at least a portion of the second primer layer, wherein the functional coating consists of two reflective metallic layers, and wherein the coated article has a RgL* value of at least 42, and no more than 55.

2. The coated article of claim 1, wherein the RgL* value is no more than 52.

3. The coated article of claim 1, wherein at least one of the reflective metallic layers comprises at least one of silver or gold.

4. The coated article of claim 1, wherein at least one of the reflective metallic layers comprise metallic silver.

5. The coated article of claim 1, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

6. The coated article of claim 1, wherein the second film of the first dielectric layer comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

7. The coated article of claim 1, wherein the first film of the second dielectric layer comprises zinc oxide, the second film of the second dielectric layer comprises zinc stannate, and the third film of the second dielectric layer comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

8. The coated article of claim 1, wherein the third dielectric layer comprises a first film in direct contact with at least a portion of the second primer layer comprising zinc oxide or zinc stannate, and a second film comprising zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide in direct contact with at least a portion of the first film.

9. The coated article of claim 1, further comprising an outermost protective coating comprising a protective layer, wherein the protective layer comprises at least one of $Si_3N_4$, SiON, SiAlN, SiAlON, titania, alumina, silica, or zirconia.

10. The coated article of claim 9, wherein the protective layer comprises silicon aluminum oxide or titanium aluminum oxide.

11. The coated article of claim 1, wherein at least one of the first primer layer or the second primer layer is selected from the group consisting of zinc, aluminum, vanadium, tungsten, niobium, zirconium, manganese, chromium, tin, nickel, germanium, magnesium, molybdenum, silver, silicon carbon, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, and wherein the primer is deposited as a metal and subsequently oxidized.

12. The coated article of claim 1, wherein the coated article has a visible light transmission of greater than 70%.

13. A coated article comprising:
a substrate; and
a functional coating applied over at least a portion of the substrate, the functional coating comprising:
a first dielectric layer in direct contact with at least a portion of the substrate, wherein the first dielectric layer consists of a first film in direct contact with at least a portion of the substrate and a second film in direct contact with at least a portion of the first film, wherein the first film of the first dielectric layer comprises zinc stannate or tin oxide;
a first reflective metallic layer in direct contact with at least a portion of the first dielectric layer;
a first primer layer in direct contact with at least a portion of the first metallic layer;
a second dielectric layer in direct contact with at least a portion of the first primer layer, wherein the second dielectric layer consists of a first film in direct contact with at least a portion of the first primer layer, a second film in direct contact with at least a portion of the first film, and a third film in direct contact with at least a portion of the second film;
a second reflective metallic layer in direct contact with at least a portion of the second dielectric layer;
a second primer layer in direct contact with at least a portion of the second metallic layer; and
a third dielectric layer in direct contact with at least a portion of the second primer layer,
wherein the functional coating consists of two reflective metallic layers,
wherein a total combined thickness of the two reflective metallic layers is at least 10 nanometers, and no more than 30 nanometers, and
wherein the coated article has a RgL* value of at least 42, and no more than 55.

14. The coated article of claim 13, wherein the total combined thickness of the two reflective metallic layers is at least 12 nm and not more than 25 nanometers.

15. The coated article of claim 14, wherein the total combined thickness of the two reflective metallic layers is no more than 18 nanometers.

16. The coated article of claim 13, wherein at least one of the reflective metallic layers comprise metallic silver.

17. The coated article of claim 13, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

18. A method of making a coated article comprising:
providing a substrate; and
applying a functional coating over at least a portion of the substrate, wherein the applying the functional coating step comprises:
forming a first dielectric layer in direct contact with at least a portion of the substrate, wherein the first dielectric layer consists of a first film in direct contact with at least a portion of the substrate and a second film in direct contact with at least a portion of the first film, wherein the first film of the first dielectric layer comprises zinc stannate or tin oxide;

forming a first reflective metallic layer in direct contact with at least a portion of the first dielectric layer;

forming a first primer layer in direct contact with at least a portion of the first metallic layer;

forming a second dielectric layer in direct contact with at least a portion of the first primer layer, wherein the second dielectric layer consists of a first film in direct contact with at least a portion of the first primer layer, a second film in direct contact with at least a portion of the first film, and a third film in direct contact with at least a portion of the second film;

forming a second reflective metallic layer in direct contact with at least a portion of the second dielectric layer;

forming a second primer layer in direct contact with at least a portion of the second metallic layer; and forming a third dielectric layer in direct contact with at least a portion of the second primer layer, wherein the functional coating consists of two reflective metallic layers, wherein a total combined thickness of the two reflective metallic layers is at least 10 nanometers, and no more than 30 nanometers, and wherein the coated article has a RgL* value of at least 42, and no more than 55.

* * * * *